United States Patent
Kitsunezuka

(10) Patent No.: US 8,630,380 B2
(45) Date of Patent: Jan. 14, 2014

(54) RECEIVER APPARATUS, IMAGE SIGNAL ATTENUATING METHOD, AND MISMATCH COMPENSATING METHOD

(75) Inventor: Masaki Kitsunezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 65 days.

(21) Appl. No.: 13/132,489

(22) PCT Filed: Dec. 25, 2009

(86) PCT No.: PCT/JP2009/007301
§ 371 (c)(1),
(2), (4) Date: Jun. 2, 2011

(87) PCT Pub. No.: WO2010/073720
PCT Pub. Date: Jul. 1, 2010

(65) Prior Publication Data
US 2011/0243287 A1 Oct. 6, 2011

(30) Foreign Application Priority Data
Dec. 26, 2008 (JP) .................................. 2008-332675

(51) Int. Cl.
*H04B 1/10* (2006.01)
(52) U.S. Cl.
USPC ........................................................ 375/350
(58) Field of Classification Search
USPC ........................................................ 375/350
See application file for complete search history.

(56) References Cited

U.S. PATENT DOCUMENTS

2006/0088136 A1* 4/2006 Morie et al. .................. 375/350

FOREIGN PATENT DOCUMENTS

| JP | 6-104807 A | 4/1994 |
| JP | 2006101388 A | 4/2006 |
| JP | 2006157866 A | 6/2006 |
| JP | 2007104522 A | 4/2007 |
| JP | 2008124954 A | 5/2008 |

OTHER PUBLICATIONS

International Search Report for PCT/JP2009/007301 mailed Feb. 16, 2010.

* cited by examiner

*Primary Examiner* — Chieh M Fan
*Assistant Examiner* — Tanmay Shah

(57) ABSTRACT

To improve the degree of removal of unwanted component signals with a small area while eliminating the need for a high-frequency signal source. IF band simulated image signals IM-I, IM-Q output from an IF band simulated image signal generating unit (12) are input to a quadrature mixer (14) through a path switch (13). The signals IM-I and IM-Q which are fed through and output from the quadrature mixer (14) are output from a complex filter (16), and the amplitudes of the signals IM-I and IM-Q are detected by an amplitude detecting unit (17). Based on the detected amplitudes, an element value control unit (18) controls element values of constituent elements of the complex filter (16) so as to decrease the amplitudes.

10 Claims, 11 Drawing Sheets

RECEIVER APPARATUS, IMAGE SIGNAL ATTENUATING METHOD, AND MISMATCH COMPENSATING METHOD

TECHNICAL FIELD

The present invention relates to a receiver apparatus, an image signal attenuating method for a low IF type receiver apparatus, a complex filter, and a receiver apparatus, and a mismatch compensating method for a low IF type receiver apparatus. In particular, the present invention relates to a receiver apparatus in which means for removing an image signal generated upon reception of a received signal is improved even when a mismatch or the like occurs in a circuit element within a receiver system, an image signal attenuating method for a low IF type receiver apparatus, a complex filter, and a receiver apparatus, and a mismatch compensating method for a low IF type receiver apparatus.

BACKGROUND ART

In a low IF (Intermediate Frequency) type radio signal receiver system, which has been hitherto known, demodulated signals include, in principle, not only a desired actual signal but also an image signal as an unwanted component which is a frequency component having an opposite sign to that of the frequency component of the actual signal due to its generation mechanism. In order to remove the unwanted component as much as possible, a complex filter is used.

The complex filter has a function of allowing the actual signal to pass and attenuating the image signal. A gain in the frequency band of the actual signal of the complex filter is desirably higher than a gain in the frequency band of the image signal. A ratio between the gains is called an image rejection ratio. Accordingly, the complex filter is required to have a high image rejection ratio.

FIG. 10 shows an example of the radio signal receiver system as described above. In this receiver system, an LNA (Low Noise Amplifier) 111 amplifies a high-frequency received signal which is received by an antenna and quadrature-modulated. A quadrature mixer 113I integrates the high-frequency received signal amplified by the LNA 111 and an output signal LO-I of a local oscillator (LO) 112. Further, a quadrature mixer 113Q integrates the high-frequency received signal amplified by the LNA 111 and an output signal LO-Q of the local oscillator 112. The output signal LO-Q is shifted in phase by 90 degrees from the output signal LO-I.

Thus, the high-frequency received signal is subjected to quadrature modulation while being down-converted to an intermediate frequency (IF band), thereby generating an IF-I signal and an IF-Q signal which are shifted in phase by 90 degrees from each other. A complex filter 114 removes image signals from the received IF-I signal and IF-Q signal.

A VGA (Variable Gain Amplifier) 115 amplifies the received signal to an appropriate amplitude. An ADC (Analog-Digital Converter) 116 converts the received analog signal into a digital signal. A digital signal processing unit 117 receives the converted digital signal and carries out various digital processing.

Though the image signals can be removed by using the complex filter as described above, it is necessary that the received IF-I signal and IF-Q signal have the same amplitude and have a phase of 90 degrees in order to secure a sufficient image rejection ratio.

However, due to a mismatch between elements or lines in the quadrature mixers or the complex filter, it is practically impossible to maintain the ideal relationship between the IF-I signal and the IF-Q signal. As shown in FIG. 11, this effect is considerably large in the image frequency band, and only a small mismatch considerably deteriorates the image rejection ratio.

A first related art for improving the image rejection ratio is disclosed in Patent Literature 1. In the first related art disclosed in Patent Literature 1, as shown in FIG. 12, IF band simulated image signals are input to a complex filter circuit 125, and an amplitude detecting unit 126 detects amplitudes of the simulated image signals output from the complex filter circuit 125. Then, based on the detected amplitudes, a filter control unit 127 sets element values in a register group within an element value control unit 1252 so as to decrease the amplitudes of the IF band simulated image signals. The element value control unit 1252 adjusts and controls the element values of an I filter 1251I and a Q filter 1251Q within the complex filter circuit 125, thereby trying to compensate for an IQ mismatch in the complex filter circuit 125.

A second related art for improving the image rejection ratio is disclosed in Patent Literature 2. In the second related art disclosed in Patent Literature 2, as shown in FIG. 13, a calibration signal of an RF band is generated from a calibration signal source 131 under the control of a calibration control circuit 130. The calibration signal is input to a quadrature mixer 133 through a calibration signal switch 132. Further, an I component signal and a Q component signal, which are obtained by frequency conversion into an IF band, are output. Then, the I component signal is input to a filter mismatch calibration circuit 138 through an I component signal path 134 and an ADC 136, and the Q component signal is input to a filter mismatch detecting circuit 139 through a Q component signal path 135 and an ADC 137.

The filter mismatch detecting circuit 139 detects a mismatch occurring in the quadrature mixer 133, the I component signal path 134, the Q component signal path 135, and the ADCs 136 and 137.

Based on the detected mismatch, a tap coefficient calculating circuit 140 calculates a tap coefficient of the filter mismatch calibration circuit 138, and updates the tap coefficient of the filter mismatch calibration circuit 138 with the calculated tap coefficient.

Thus, the image rejection ratio between the I component signal and the Q component signal is improved.

Further, Patent Literature 3 discloses, as a third related art, a radio receiving circuit having the following configuration. That is, a pair of intermediate frequency signals are generated by converting the frequency of an input signal using a mixer for every two local oscillation signals having the same frequency and shifted in phase by 90 degrees from each other, and the intermediate frequency signal corresponding to the local oscillation signal with a phase delay of 90 degrees is shifted by a predetermined amount of phase. After that, the phase-shifted intermediate frequency signal and the other intermediate frequency signal are added to be output as an intermediate frequency signal. The radio receiving circuit disclosed as the third related art is configured to cancel the image signal component by using a reference image signal of an image frequency, which is a frequency corresponding to a difference between a local oscillation frequency and an intermediate frequency, as an input signal supplied to the mixer, in an adjustment mode of the radio receiving circuit for cancelling the image signal component generated due to variations in the paths through which the two intermediate frequency signals pass.

CITATION LIST

Patent Literature

[Patent Literature 1] Japanese Unexamined Patent Application Publication No. 2006-157866
[Patent Literature 2] Japanese Unexamined Patent Application Publication No. 2007-104522
[Patent Literature 3] Japanese Unexamined Patent Application Publication No. 2008-124954

SUMMARY OF INVENTION

Technical Problem

Any of the first to third related arts discloses a technique for compensating for a mismatch occurring in elements, lines, and the like within two signal paths formed in a receiver. In the first related art disclosed in Patent Literature 1, however, the IF band simulated image signals are input to the complex filter to compensate for the mismatch described above. Accordingly, in principle, it is impossible to compensate for a mismatch occurring in a quadrature mixer.

Further, in the second related art disclosed in Patent Literature 2, a calibration signal of an RF band is input to the quadrature mixer to compensate for the mismatch of the same type as that is Patent Literature 1. This makes it possible to compensate for a mismatch occurring in the quadrature mixer, but a high-frequency signal source serving as a calibration signal source is an essential constituent element. Accordingly, the area of the receiver is increased, resulting in an unavoidable increase in cost. Furthermore, the related art merely discloses an example of compensating for the mismatch using the calibration signal of the RF band, and there is no mention about a solution to the same technical problem by using other calibration signals.

The explanation given above on the second related art also holds true of the third related art disclosed in Patent Literature 3. The reason is that in the adjustment mode, the signal input to the mixer is the reference image signal of the image frequency which is the frequency corresponding to the difference between the local oscillation frequency and the intermediate frequency as described above.

The present invention has been made in view of the above-mentioned circumstances, and therefore has an object to provide a receiver apparatus which uses an IF band simulated image signal, which is obtained by simulating an image signal (unwanted component signal) generated in the apparatus, or the like in a calibration mode of the apparatus, and an image signal attenuating method and a mismatch compensating method for a low IF type receiver apparatus, a complex filter, and a receiver apparatus.

Solution to Problem

To solve the above-mentioned problems, a first constitution of the present invention is a receiver apparatus including means that attenuates an image signal generated upon reception of a received signal. The receiver apparatus includes: a signal processing section that outputs an actual signal and an image signal based on a received signal; a signal supply section that supplies a simulated image signal obtained by simulating the image signal as a calibration signal to the signal processing section in a calibration mode for adjusting an attenuance of the image signal; and a filtering section that attenuates the image signal and allows the actual signal to pass, after the attenuance of the image signal is adjusted using the calibration signal input through the signal processing section.

A second constitution of the present invention is an image signal attenuating method for a receiver apparatus, including: outputting, by a signal processing section, an actual signal and an image signal based on a received signal; and supplying a simulated image signal obtained by simulating the image signal as a calibration signal to the signal processing section in a calibration mode for adjusting, by a filtering section, an attenuance of the output image signal based on the calibration signal input through the signal processing section.

Advantageous Effects of Invention

According to the present invention, a simulated image signal obtained by simulating an image signal is used for adjustment of the attenuance of the image signal generated in a receiver apparatus, thereby improving the degree of removal of the image signal with a small area while eliminating the need for a high-frequency signal source.

DESCRIPTION OF EMBODIMENTS

The present invention is configured to include a simulated image signal, which is obtained by simulating an image signal generated in a receiver apparatus, as a calibration signal for adjusting the attenuance of the image signal.

First Exemplary Embodiment

Figure 1:
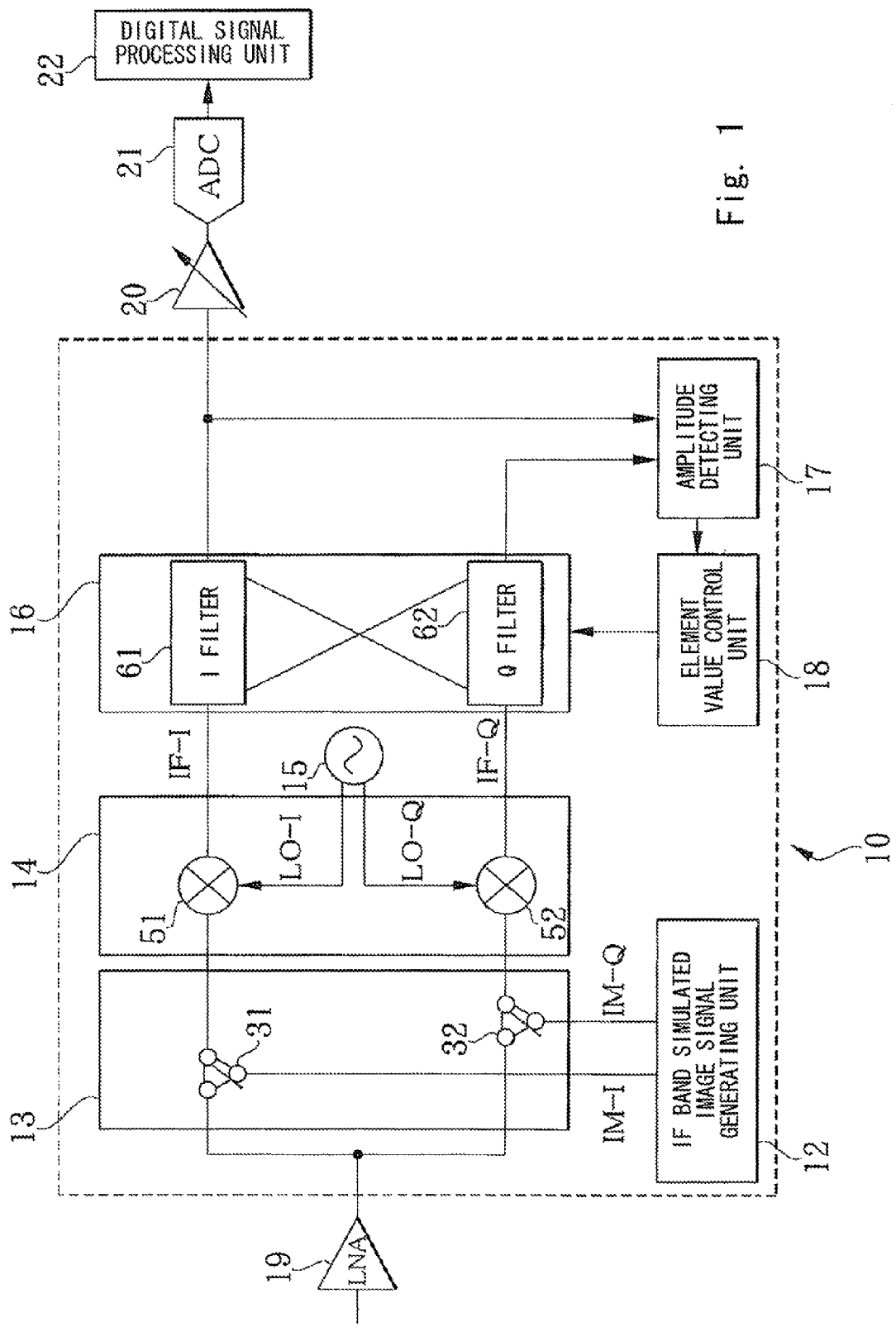
FIG. 1 is a diagram showing an electrical configuration of a low IF type receiver apparatus according to a first exemplary embodiment of the present invention.
Figure 2:
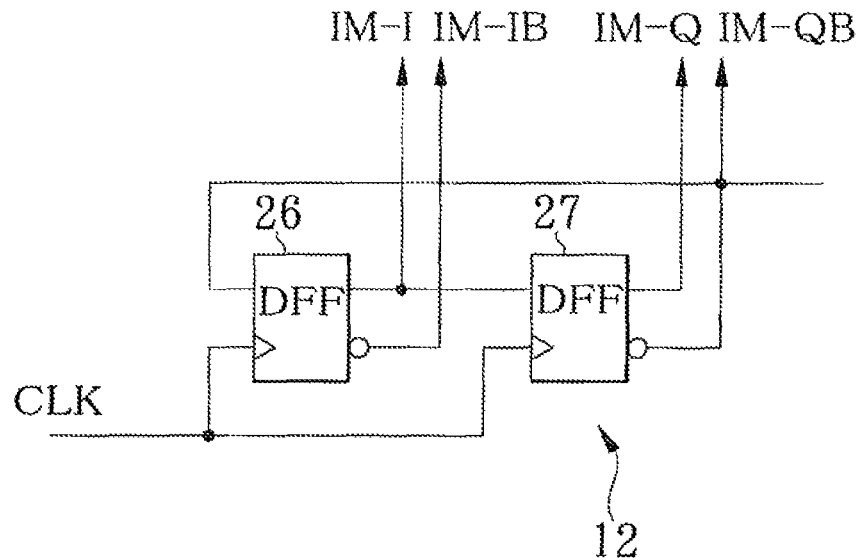
FIG. 2 is a diagram showing a circuit configuration of an IF band simulated image signal generating unit for use in the low IF type receiver apparatus.
Figure 3:
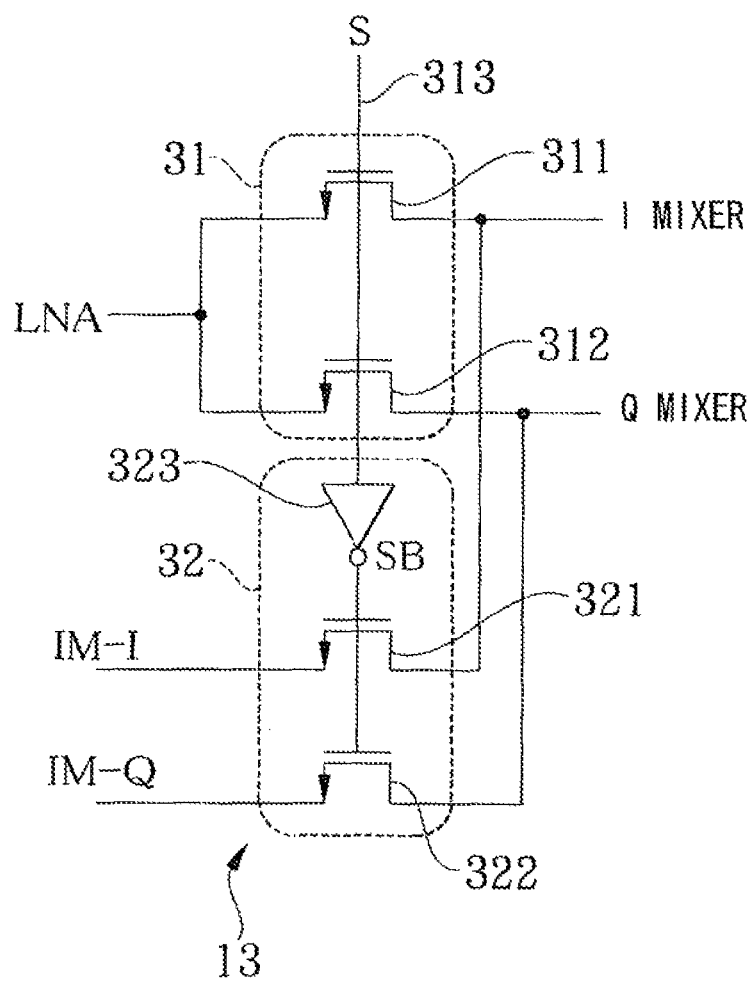
FIG. 3 is a diagram showing a path switching circuit for use in the low IF type receiver apparatus.
Figure 4:
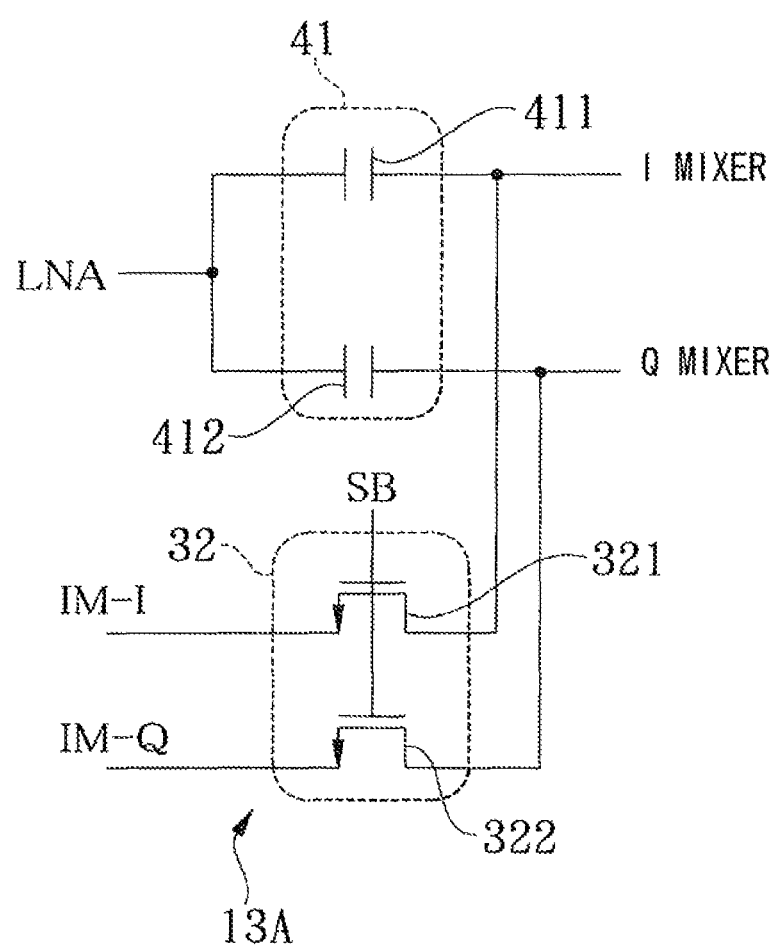
FIG. 4 is a diagram showing another path switching circuit for use in the low IF type receiver apparatus.
Figure 5:
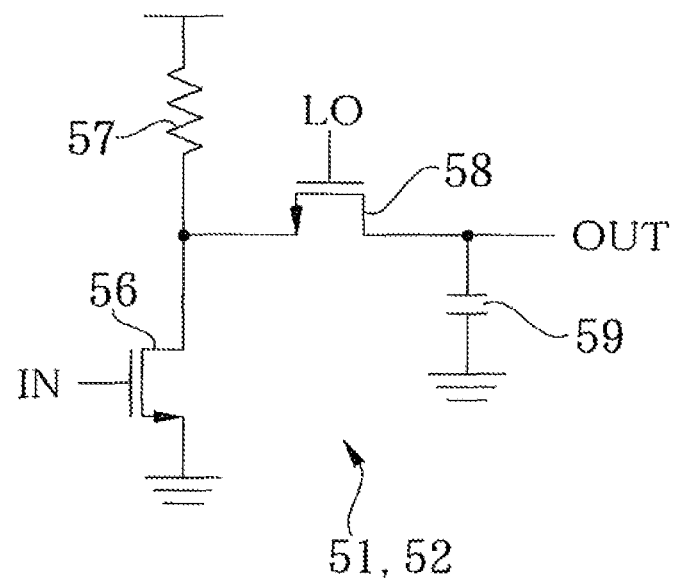
FIG. 5 is a diagram showing a circuit configuration of each of an I mixer and a Q mixer which constitute a quadrature mixer for use in the low IF type receiver apparatus.
Figure 6:
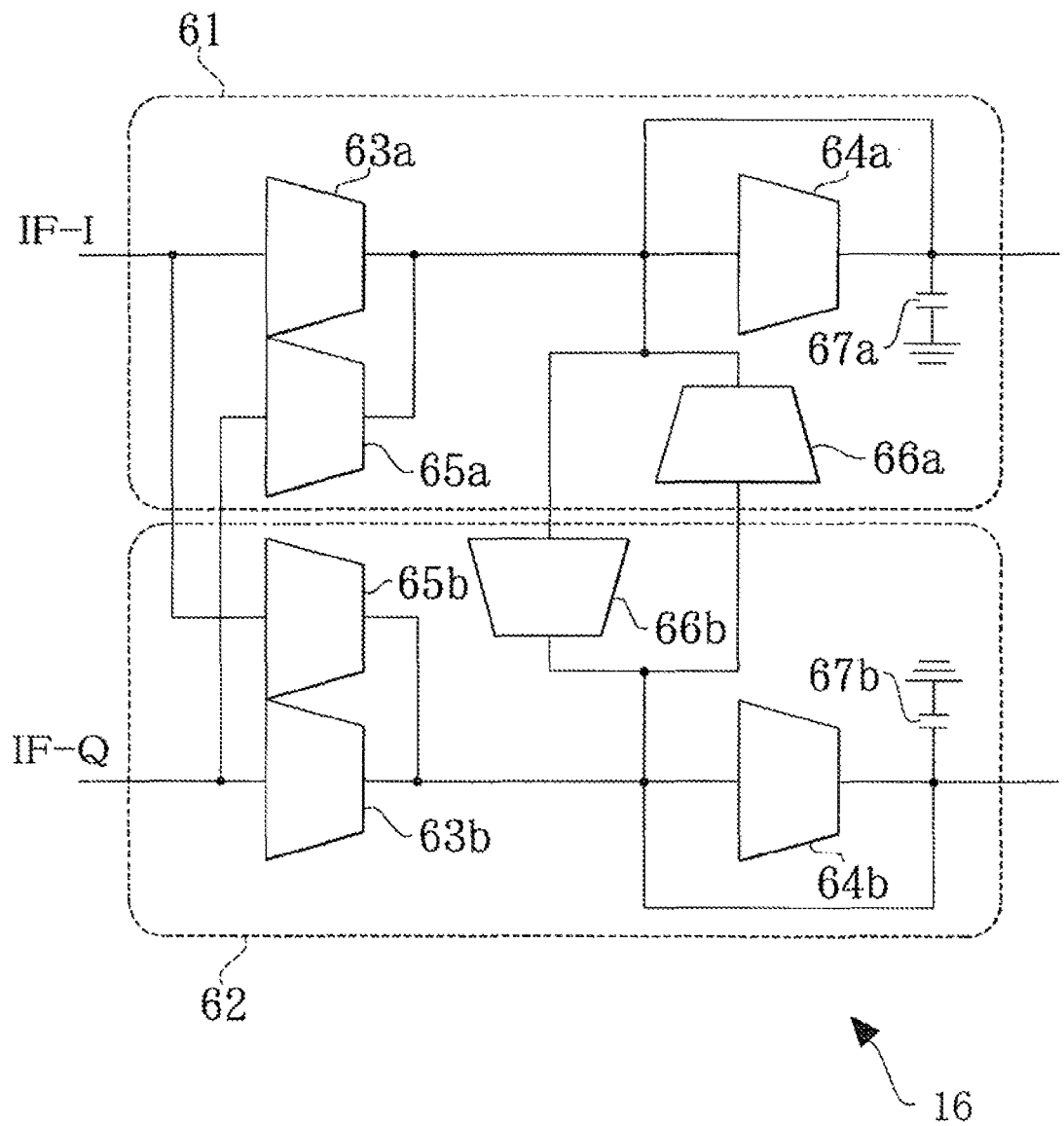
FIG. 6 is a block diagram showing an example of a complex filter for use in the low IF type receiver apparatus.
Figure 7:
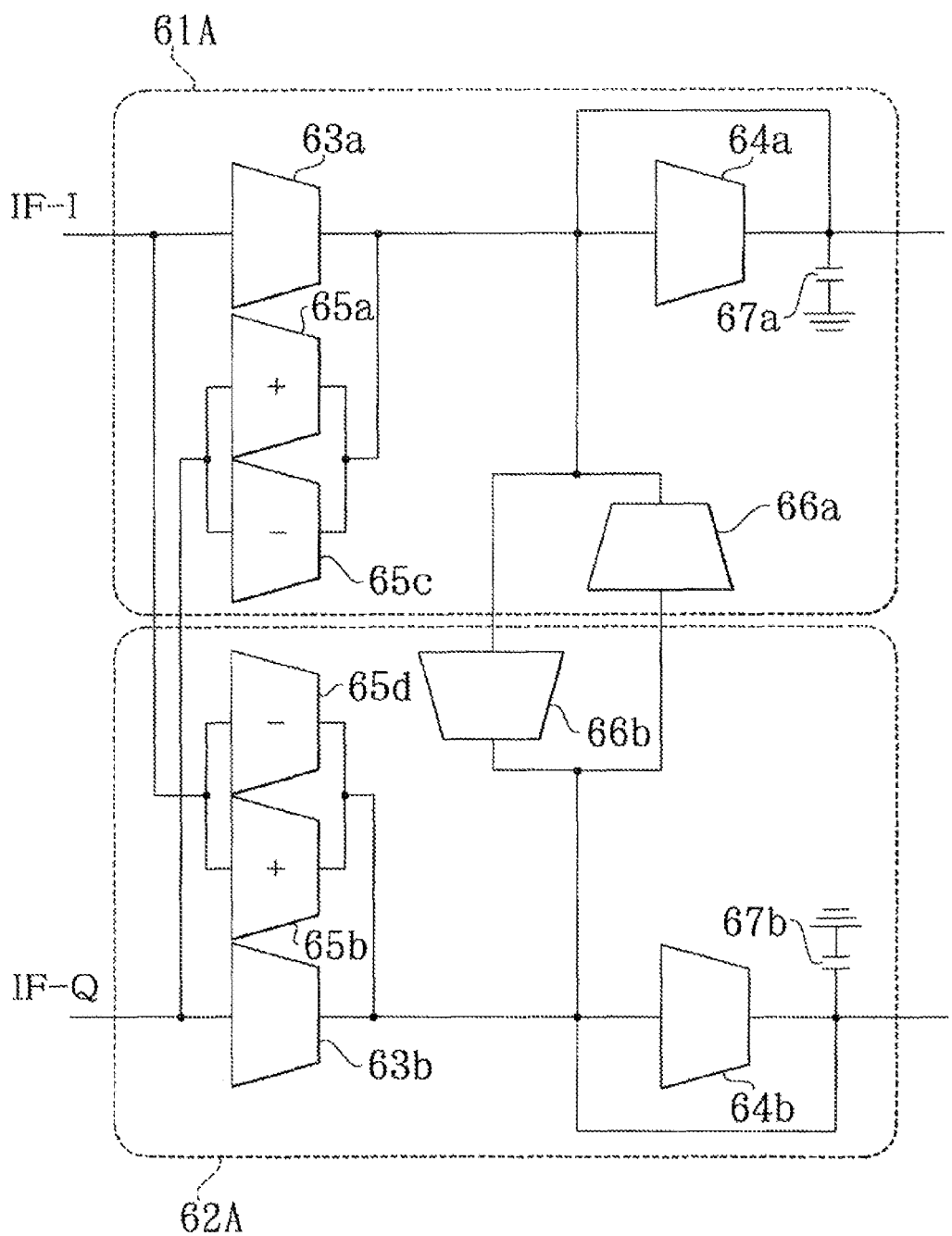
FIG. 7 is a block diagram showing another example of the complex filter for use in the low IF type receiver apparatus.
Figure 8:
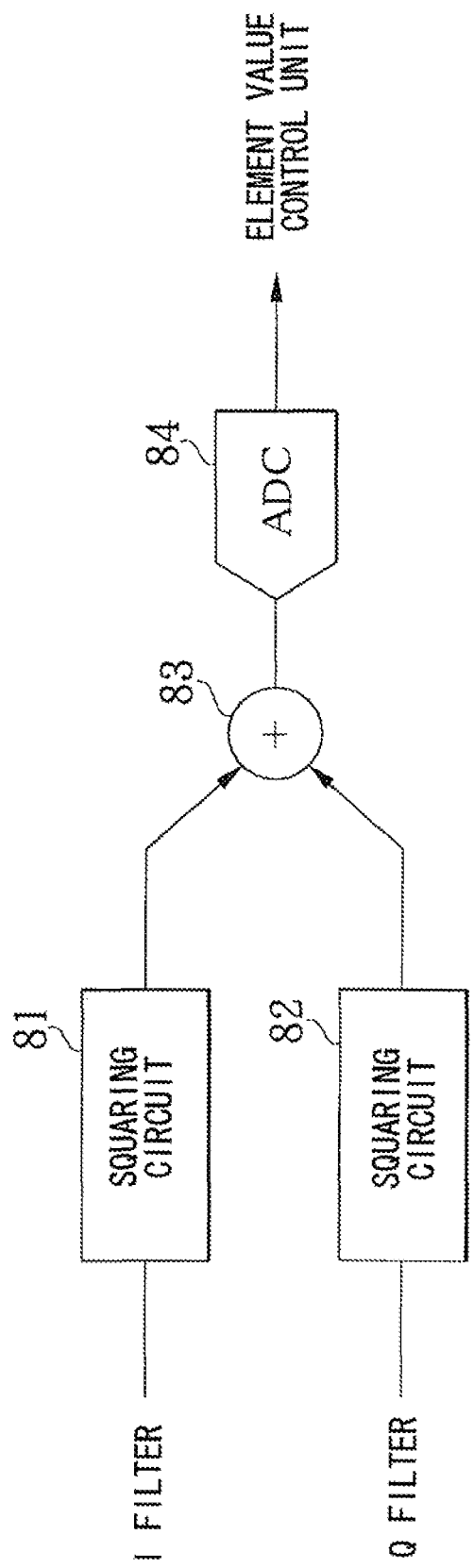
FIG. 8 is a block diagram showing an exemplary configuration of an amplitude detecting unit for use in the low IF type receiver apparatus.

FIG. 1 is a diagram showing an electrical configuration of a low IF type receiver apparatus according to a first exemplary embodiment of the present invention. FIG. 2 is a diagram showing a circuit configuration of an IF band simulated image signal generating unit for use in the low IF type receiver apparatus. FIG. 3 is a diagram showing a path switching circuit for use in the low IF type receiver apparatus. FIG. 4 is a diagram showing another path switching circuit for use in the low IF type receiver apparatus. FIG. 5 is a diagram showing a circuit configuration of each of an I mixer and a Q mixer which constitute a quadrature mixer for use in the low IF type receiver apparatus. FIG. 6 is a block diagram showing an example of a complex filter for use in the low IF type receiver apparatus. FIG. 7 is a block diagram showing an example of another example of the complex filter for use in the low IF type receiver apparatus. FIG. 8 is a block diagram showing an exemplary configuration of an amplitude detecting unit for use in the low IF type receiver apparatus.

A low IF type receiver apparatus (an exemplary receiver apparatus) 10 of this exemplary embodiment is an apparatus which uses an IF band simulated image signal in order to improve an image rejection ratio of unwanted component signals (image signals) even if a mismatch occurs in circuit elements within a demodulating circuit system for demodulating quadrature modulation signals. The principal part of the low IF type receiver apparatus 10 is generally composed of an IF band simulated image signal generating unit 12, a path switch 13, a quadrature mixer 14, a local oscillator (LO) 15, a complex filter 16, an amplitude detecting unit 17, and an element value control unit 18. In addition, the low IF type receiver apparatus 10 includes an LNA (Low Noise Amplifier) 19, which amplifies a high-frequency quadrature modulation signal received by an antenna (not shown), a variable gain amplifier (VGA) 20, an analog-digital converter (ADC) 21, and a digital signal processing unit 22. The IF is an abbreviation for intermediate frequency.

The IF band simulated image signal generating unit 12 is signal generating section that separately generates and outputs IF band simulated image signals IM-I and IM-Q, each of which has a frequency with an opposite sign to that of the frequency of an IF band signal, with respect to frequencies of desired IF actual signals which are frequency-converted by the quadrature mixer 14 and output from the quadrature mixer 14.

As shown in FIG. 2, the IF band simulated image signal generating unit 12 includes delay flip-flop circuits (DFFs) 26 and 27.

A one-phase clock signal CLK from a clock source (not shown) is input to each of the delay flip-flop circuits 26 and 27. The frequency of the clock signal is four times the intermediate frequency of the IF band actual signal output from the quadrature mixer 14. The delay flip-flop circuit 26 is a circuit which generates IF band simulated image signals IM-I and IM-IB, and the delay flip-flop circuit 27 is a circuit which generates IF band simulated image signals IM-Q and IM-QB. In this exemplary embodiment, however, the IF band simulated image signal IM-I and the IF band simulated image signal IM-Q are used. That is, as shown in FIG. 1, the IF band simulated image signal generating unit 12 has a function of outputting the IF band simulated image signal IM-I and the IF band simulated image signal IM-Q.

Further, at a preceding stage of the path switch 13, a low-pass filter may be disposed so as to remove unnecessary high-frequency waves contained in the IF band simulated image signals.

IM-IB, IM-Q, and IM-QB are signals shifted in phase by 180 degrees, 90 degrees, and 270 degrees, respectively, with respect to the signal IM-I among the IF band simulated image signals generated by the delay flip-flop circuits 26 and 27. The amplitudes of the IF band simulated image signals IM-I, IM-IB, IM-Q, and IM-QB are preferably increased as much as possible within the input dynamic ranges of the quadrature mixer 14 and the complex filter 16.

The path switch 13 is a switch which selectively supplies the quadrature modulation signal from the LNA 19 and the IF band simulated image signals IM-I and IM-Q from the IF band simulated image signal generating unit 12 to an I mixer 51 and a Q mixer 52 of the quadrature mixer 14. FIG. 3 shows an example of the path switch 13, and FIG. 4 shows another example of the path switch 13. The path switch 13 shown in FIG. 3 includes a switch 31 which supplies the quadrature modulation signal from the LNA 19 to the I mixer 51 and the Q mixer 52 of the quadrature mixer 14, and a switch 32 which supplies the IF band simulated image signals IM-I and IM-Q from the IF band simulated image signal generating unit 12 to the I mixer 51 and the Q mixer 52 of the quadrature mixer 14.

The switch 31 includes two N-channel MOSFETs (hereinafter abbreviated as "NMOSs") 311 and 312. The switch 32 includes two NMOSs 321 and 322 and an inverter 323. An input of the inverter 323 is connected with a switch signal line 313 which is connected to the gates of the NMOSs 311 and 312 of the switch 31, and an output of the inverter 323 is connected to the gates of the NMOSs 321 and 322. The switch signal line 313 is supplied with a switch signal S.

Further, a path switch 13A shown in FIG. 4 includes a switch 41 in place of the switch 31 of the path switch 13 shown in FIG. 3. The switch 41 is configured to prevent the LNA 19, which is described later, from outputting a signal, and includes capacitors 411 and 412.

The path switch 13 shown in FIG. 3 is configured to switch the signal to be supplied to the quadrature mixer 14 by setting the switch control signal S supplied to the switch signal line 313 to a low level in a calibration mode and by setting the switch control signal S to a high level in a communication mode. Note that when the high-frequency output signal of the LNA 19 is transferred through the path switch 13 configured as shown in FIG. 3, a finite on-resistance is generated in the path. Accordingly, signal power loss cannot be ignored.

In order to avoid this drawback, the path switch 13A configured as shown in FIG. 4 is used. That is, in the configuration shown in FIG. 4, when the capacitances of the capacitors 411 and 412 are set to be sufficiently larger than the input capacitance of the quadrature mixer 14, the capacitors 411 and 412 can be assumed to be almost short-circuited with respect to the high-frequency signal, thereby suppressing signal power loss. In the calibration mode when the path switch 13A shown in FIG. 4 is used, the LAN 19 is configured to output no signal, and the switch control signal input to the switch 32 is set to the high level. As technical means for preventing the LAN 19 from outputting a signal without using a switch in the path for the high-frequency signal, there is a method for interrupting a bias current or power supplied to the LAN 19.

The quadrature mixer 14 is a circuit which converts the frequency of the quadrature modulation signal of the RF band, which is a high-frequency signal, by using the local oscillation signal, and includes the I mixer 51 and the Q mixer 52. The quadrature modulation signal of the RF band input to the quadrature mixer 14 is frequency-converted and output. Meanwhile, the IF band simulated image signals input to the quadrature mixer 14 are directly fed therethrough and output.

As shown in FIG. 5, the quadrature mixer 14 includes an NMOS 56, a resistor 57, an NMOS 58, and a capacitor 59, which are provided for each of the quadrature components (I filter 61 and Q filter 62). The gate of the NMOS 56 receives a signal (IN) from the path switch 13. The gate of the NMOS 58 receives a local oscillation signal (LO). The output signal of the quadrature mixer 14 includes a feed-through component in a frequency of a high-frequency received signal (or IF band simulated image signal), a feed-through component in a frequency of a LO, frequency components in frequencies respectively corresponding to the sum and difference between a frequency of a high-frequency received signal (or IF band simulated image signal) and a frequency of a local oscillation signal, and other high-frequency components. The capacitor 59 is an element which removes the high-frequency signal contained in the output signal.

The quadrature mixer 14 shown in FIG. 5 is configured to enable or disable the detection of an IQ mismatch. Factors that enable the detection of the IQ mismatch include a variation in the threshold voltage of transistors receiving the received signal or the IF band simulated image signal, and a variation in load resistance. A variation in load capacitance equally affects the amplitude or phase of the output signal, regardless of whether it is the received signal or the IF band simulated image signal. This makes it possible to detect the degree of the IQ mismatch in the received IF band simulated image signal.

Factors that disable the detection of the IQ mismatch include a mismatch in wiring resistance or input capacitance of a transistor. In the I mixer and the Q mixer, if a mismatch in wiring resistance or input capacitance of a transistor exists, the mismatch cannot be detected by the IF band simulated image signal, because the high-frequency band and the IF band have different phase rotation angles. Also when the phase difference between the local oscillation signal LO-I and the local oscillation signal LO-Q deviates from the ideal phase difference of 90 degrees, the degree of deviation cannot be detected by the IF band image signal.

In order to avoid these inconveniences, it is necessary to design a layout while paying attention to the symmetry between the I mixer and the Q mixer and to design the local oscillator (LO) 15 in such a manner that the phase difference between the local oscillation signal LO-I and the local oscillation signal LO-Q is set to 90 degrees, especially in the path for the high-frequency signal.

Also in the calibration mode, a deviation in amplitude between the IF band simulated image signal IF-I and the IF band simulated image signal IF-Q due to a deviation in the duiy ratio between the signals LO-I and LO-Q can also be corrected by inputting the local oscillation signal LO-I and the local oscillation signal LO-Q to the I mixer 51 and the Q mixer 52, respectively. However, there is no need to input both the signals LO-I and LO-Q. Even when the LO output signal is fixed to the high level, the operation can be carried out.

The local oscillator 15 is an oscillation circuit that supplies the local oscillation signal LO-I to the quadrature mixer (I mixer) 51 and supplies the local oscillation signal LO-Q to the quadrature mixer (Q mixer) 52.

The complex filter 16 includes an I filter 61 and a Q filter 62 (FIGS. 1 and 6).

The complex filter 16 is a primary Gm-C filter using voltage-to-current converters and a capacitor.

As shown in FIG. 6, the I filter 61 includes voltage-to-current converters 63a, 64a, 65a, and 66a and a capacitor 67a. Input and output terminals of the voltage-to-current converter 64a are short-circuited. Similarly, the Q filter 62 includes voltage-to-current converters 63b, 64b, 65b, and 66b and a capacitor 67b. Input and output terminals of the voltage-to-current converter 64b are short-circuited. The voltage-to-current converters 65a and 65b and the voltage-to-current converters 66a and 66b are voltage-to-current converters which connect the I filter 61 with the Q filter 62.

The voltage-to-current converter 63a and the voltage-to-current converter 63b output currents respectively corresponding to the input voltage signals IF-I and IF-Q. Each of the voltage-to-current converters 64a and 64b is equivalent to a load resistor and converts a current into a voltage. The capacitors 67a and 67b are load capacitors.

The pass band width of the complex filter 16 is determined by a ratio between a voltage-current conversion gain of each of the voltage-to-current converters 63a and 63b and a capacitance of each of the capacitors 67a and 67b. Further, the center frequency of the complex filter 16 is determined by a ratio between a voltage-current conversion gain of each of the voltage-to-current converters 66a and 66b and a capacitance of each of the capacitors 67a and 67b. Furthermore, the amount of phase rotation of the signal IF-I and the signal IF-Q is determined by a ratio between a voltage-current conversion gain of each of the voltage-to-current converters 63a and 63b and a voltage-current conversion gain of each of the voltage-to-current converters 65a and 65b. Moreover, the gain of the complex filter 16 is determined by a ratio between a voltage-current conversion gain of each of the voltage-to-current converters 63a and 63b and a voltage-current conversion gain of each of the voltage-to-current converters 64a and 64b.

As described above, the complex filter 16 adjusts the voltage-current conversion gain of each of the voltage-to-current converters 63a and 63b, thereby enabling compensation for the gain between IQ signals. Further, the phase between IQ signals can be compensated for by adjusting the voltage-current conversion gain of each of the voltage-to-current converters 65a and 65b. In this exemplary embodiment, the adjustment of the voltage-current conversion gain of each of the voltage-to-current converters 63a and 63b and the adjustment of the voltage-current conversion gain of each of the voltage-to-current converters 65a and 65b are performed by controlling element values of the constituent elements.

Accordingly, the complex filter 16 is configured to compensate for the IQ mismatch between the quadrature mixer 14 and the complex filter 16 by adjusting the element values in the complex filter 16, thereby enabling search for conditions for obtaining a high image rejection ratio.

In order to compensate for the phase between IQ signals, it is necessary to rotate the phases of the signal IF-I and the signal IF-Q. These phases are rotated in two directions: a direction in which the phase difference between the signal IF-I and the signal IF-Q is decreased; and a direction in which the phase difference is increased. In order to decrease the phase difference, the voltage-current conversion gain of each of the voltage-to-current converters 63a and 63b and the voltage-current conversion gain of each of the voltage-to-current converters 65a and 65b are changed with the same sign. Meanwhile, in order to increase the phase difference, the voltage-current conversion gain of each of the voltage-to-current converters 65a and 65b is changed with an opposite sign with respect to the voltage-current conversion gain of each of the voltage-to-current converters 63a and 63b.

Therefore, in order to adjust the phase difference between the signal IF-I and the signal IF-Q in a given direction, it is necessary to switch the positive and negative of the voltage-current conversion gain of each of the voltage-to-current Converters 65a and 65b.

Technical means for switching the positive and negative of the voltage-current conversion gain of the voltage-to-current converters 65a and 65b needs to be incorporated into the complex filter. The complex filter 16A is illustrated in FIG. 7.

Referring to FIG. 7, the technical means has a configuration in which voltage-to-current converters 65c and 65d with an opposite sign are connected in parallel to the voltage-tocurrent converters 65a and 65b, respectively. For example, in the case where the absolute value of the voltage-current conversion gain of the voltage-to-current converter 65a is greater than that of the voltage-current conversion gain of the voltage-to-current converter 65c, a positive current is output when the voltage-current conversion gains are summed. Meanwhile, when the magnitude relation therebetween is reversed, a negative current is output.

According to the complex filter 16A, the phase difference between the signal IF-I and the signal IF-Q can be adjusted in a given direction.

In this exemplary embodiment, the above-mentioned configuration achieves a receiver apparatus including means for attenuating an image signal generated upon reception of a received signal. Specifically, a signal processing section including the quadrature mixer 14, a filtering section including the complex filter 16, and a signal supply section including the IF band simulated image signal generating unit 12 and the path switch 13 are achieved. Here, the signal processing section outputs an actual signal and an image signal based on the received signal. The filtering section adjusts the attenuance of the image signal by using a calibration signal input through the signal processing section, and then passes through the actual signal while attenuating the image signal. Further, the signal supply section causes the signal processing section to supply a simulated image signal, which is obtained by simulating the image signal, as a calibration signal in the calibration mode for adjusting the attenuance of the image signal in the filtering section.

As shown in FIG. 8, the amplitude detecting unit 17 includes squaring circuits 81 and 82, an adder 83, and an ADC 84.

The squaring circuit 81 is a circuit which squares and outputs the output voltage signal of the I filter 61. The squaring circuit 82 is a circuit that squares and outputs the output voltage signal of the Q filter 62. The adder 83 is a circuit that adds output voltages from the squaring circuits 81 and 82, and outputs the resultant as a voltage corresponding to a signal amplitude. The ADC 84 is a circuit that converts the output voltage of the adder 83 into a digital signal.

Note that the amplitude detecting unit 17 calculates an amplitude from the output voltage signals of both the I filter 61 and the Q filter 62, but may calculate an amplitude from one of the signals.

The element value control unit 18 controls the element values in the complex filter 16 so as to decrease the amplitude of the simulated image signal detected by the amplitude detecting unit 17. The element value control unit 18 includes a register that controls the element values in the complex filter 16, and a digital signal processing unit that sweeps the configuration value of the register and searches for a configuration value of the register with which the amplitude of the IF band simulated image signal is minimized.

Referring next to FIGS. 1 to 8, operation of this exemplary embodiment will be described.

Before the low IF type receiver apparatus 10 is brought into a normal operation state, the low IF type receiver apparatus 10 is caused to operate in the calibration mode. In this calibration mode, the IF band simulated image signal is supplied to the quadrature mixer 14 instead of the high-frequency received signal output from the LNA 19, so that the low-level path switch signal S is supplied to the path switch 13 through the path switch signal line 313 (FIG. 3). Therefore, the switch 31 is brought into an opened state and the switch 32 is brought into a closed state.

Along with the supply of the path switch signal S, the clock signal CLK is supplied to the IF band simulated image signal generating unit 12. Then, the IF band simulated image signal IM-I having a frequency with an opposite sign to that of the frequency of the desired IF actual signal is output from the DFF 26, and the IF band simulated image signal IM-Q having a frequency with an opposite signal to that of the frequency of the desired IF actual signal is output from the DFF 27.

When the path switch 13 is switched as described above, the IF band simulated image signals IM-I and IM-Q output from the IF band simulated image signal generating unit 12 are respectively input to the I mixer 51 and the Q mixer 52 of the quadrature mixer 14 through the path switch 13.

The frequency of the IF band simulated image signal IM-I is not converted in the I mixer 51, and the frequency of the IF band simulated image signal IM-Q is not converted in the Q mixer 52. Thus, the IF band simulated image signal IM-I is fed through the I mixer 51 and the IF band simulated image signal IM-Q is fed through the Q mixer 52, and then the signals are output from the respective mixers.

In this manner, the phase difference between the IF band simulated image signal IM-I output from the I mixer 51 and the IF band simulated image signal IM-Q output from the Q mixer 52 deviates from the ideal phase difference of 90 degrees due to an effect of a mismatch in internal elements or lines, and an amplitude error also occurs.

These signals are directly input to the complex filter 16, which is connected to the subsequent stage, and is attenuated by the operation of the complex filter 16. The amount of attenuation varies depending on the degree of the mismatch between the quadrature mixer 14 and the complex filter 16.

The IF band simulated image signal IM-I and the IF band simulated image signal IM-Q, which are respectively output from the I mixer 61 and the Q mixer 62, are input to the amplitude detecting unit 17 and also to the VAG 20.

The amplitude detecting unit 17 detects amplitudes of the IF band simulated image signals and supplies them to the element value control unit 18.

The element value control unit 18 adjusts the element values of the constituent elements of the voltage-to-current converters, which constitute the complex filter 16, based on the amplitudes of the IF band simulated image signals, and changes the amplitude and phase of the signal received from the complex filter 16. The adjustment is performed so that the amplitudes of the IF band simulated image signal detected by the amplitude detecting unit 17 are minimized.

The adjustment of the element values is performed such that the IQ mismatch occurring in the circuit including the quadrature mixer 14 and the complex filter 16 is compensated for and conditions for generating a high image rejection ratio are searched.

After the adjustment as described above, when the low IF type receiver apparatus 10 is caused to operate in the communication mode, the path switch 13 is switched so that the high-frequency received signal output from the LNA 19 is supplied to each of the I mixer 51 and the Q mixer 52 of the quadrature mixer 14.

The IF band actual signals are respectively output from the mixer 51 and the Q mixer 52 and are supplied to the complex filter 16. Since the adjustment is completed in the complex filter 16, the element values in the complex filter 16 are in the state where the IQ mismatch between the quadrature mixer 14 and the complex filter 16 is compensated for. As a result, a high image rejection ratio can be obtained also during communication.

Among the signals output from the complex filter 16, the IF band actual signal in the state where disturbing wave including an image signal is removed (or the degree of effect on the IF band actual signal is considerably decreased) is output from the complex filter 16, and the amplitude of the IF band actual signal is amplified in an appropriate range by the VGA 20. The amplified analog signal is converted into a digital signal by the ADC 21 and is supplied to the digital signal processing unit 22. The digital signal processing unit 22 performs various signal processing including demodulation processing.

Thus, according to the configuration of this exemplary embodiment, IQ mismatches including an IQ mismatch in a quadrature mixer can be compensated for without using a high-frequency signal source for generating an IF band simulated image signal, and a high image rejection ratio can be obtained with a small area.

Second Exemplary Embodiment

Figure 9:
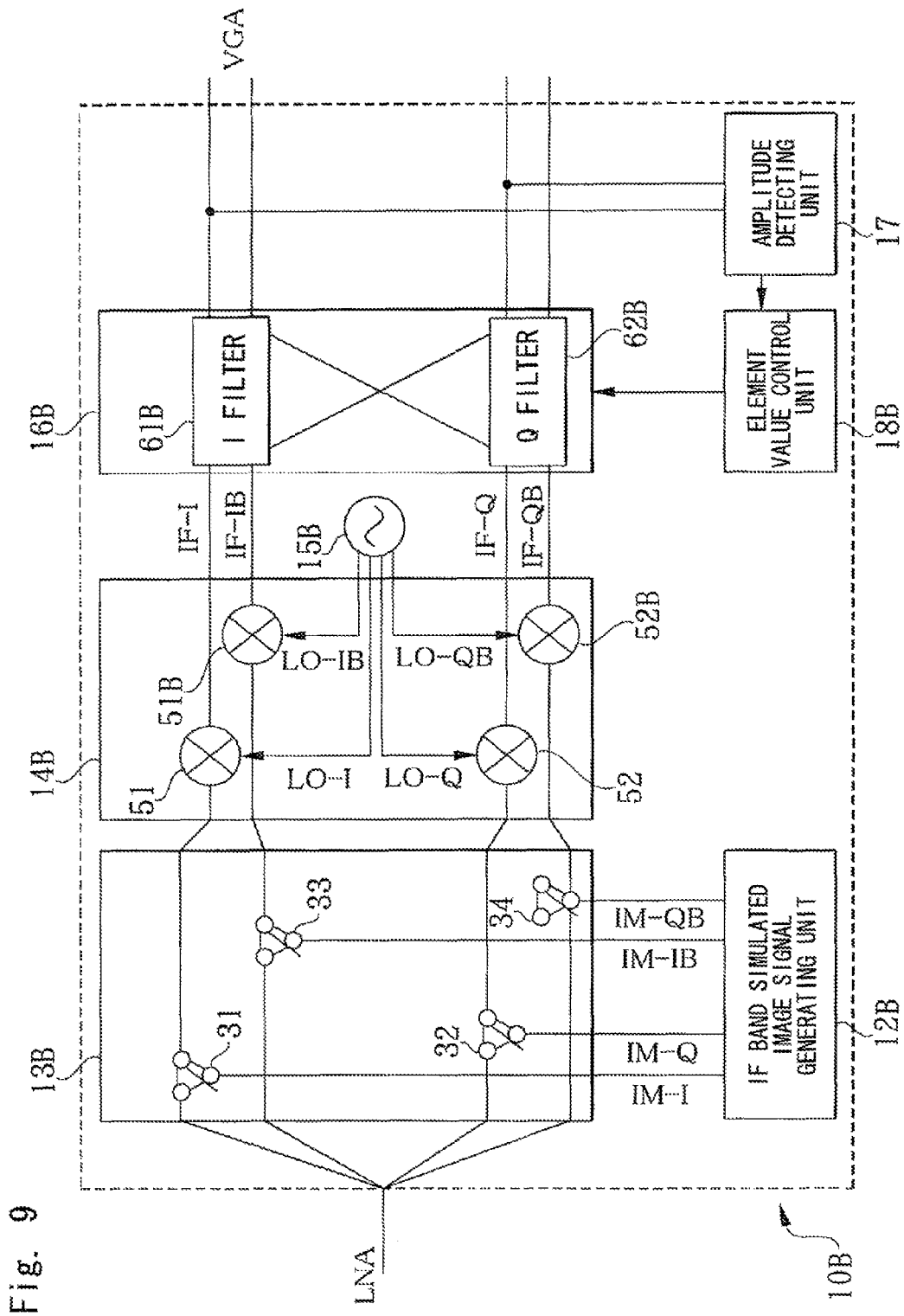
FIG. 9 is a block diagram showing an electrical configuration of a low IF type receiver apparatus according to a second exemplary embodiment of the present invention.
Figure 10:
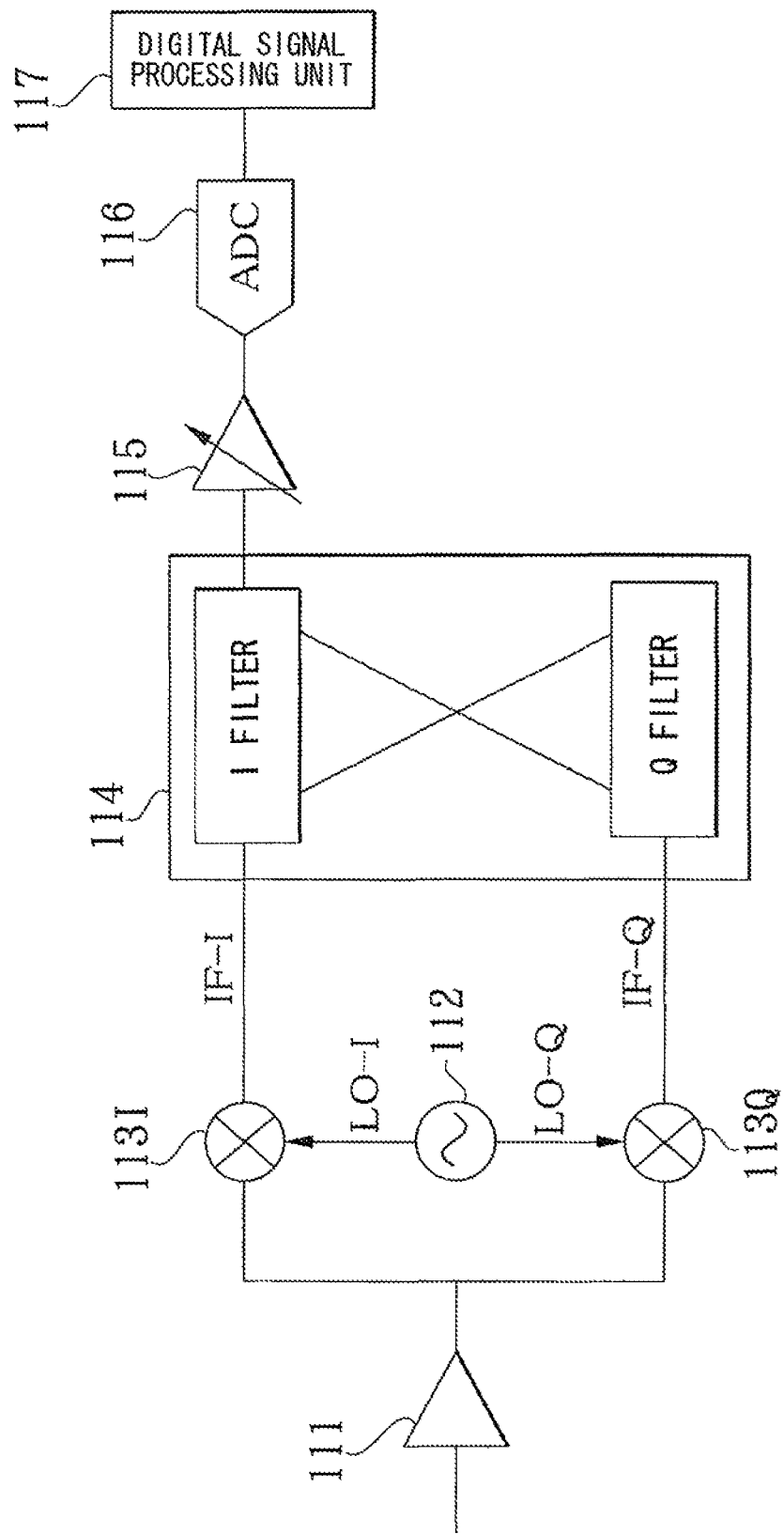
FIG. 10 is a block diagram showing an electrical configuration of a radio signal receiver system of a related art.
Figure 11:
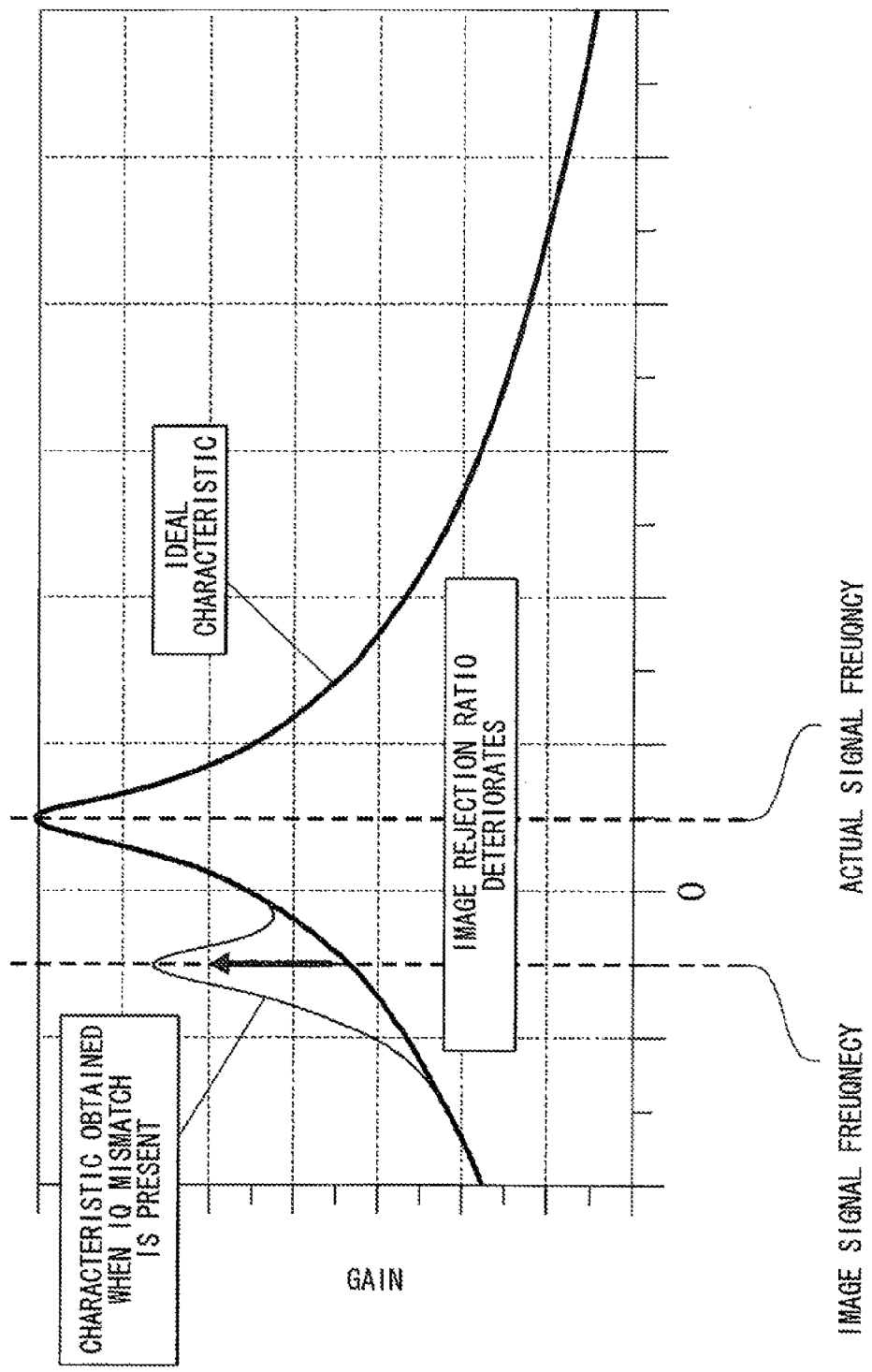
FIG. 11 is a diagram showing gain characteristics with respect to frequencies of the radio signal receiver system shown in FIG. 10.
Figure 12:
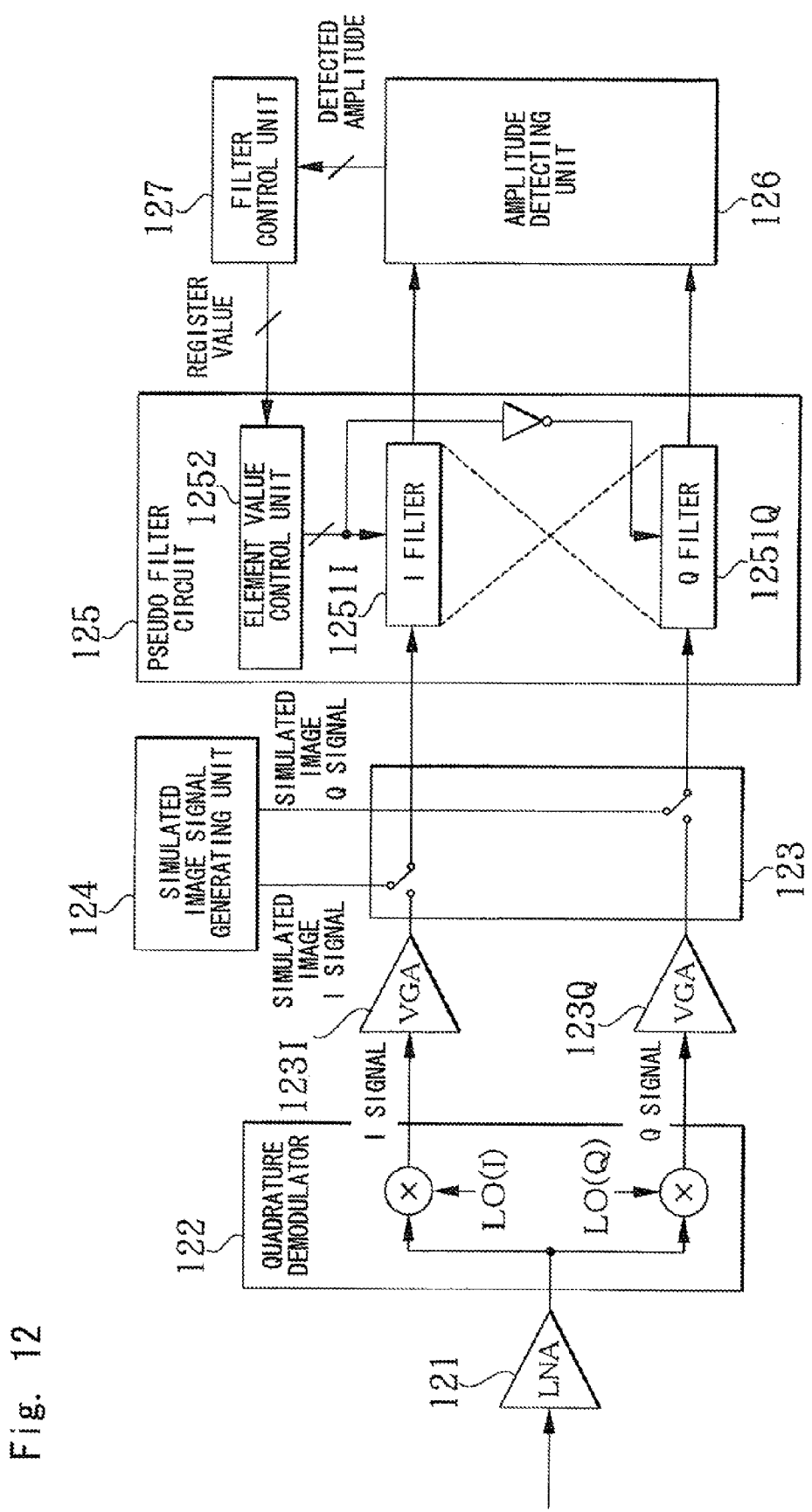
FIG. 12 is a block diagram showing an exemplary electrical configuration of a related art according to the present invention.
Figure 13:
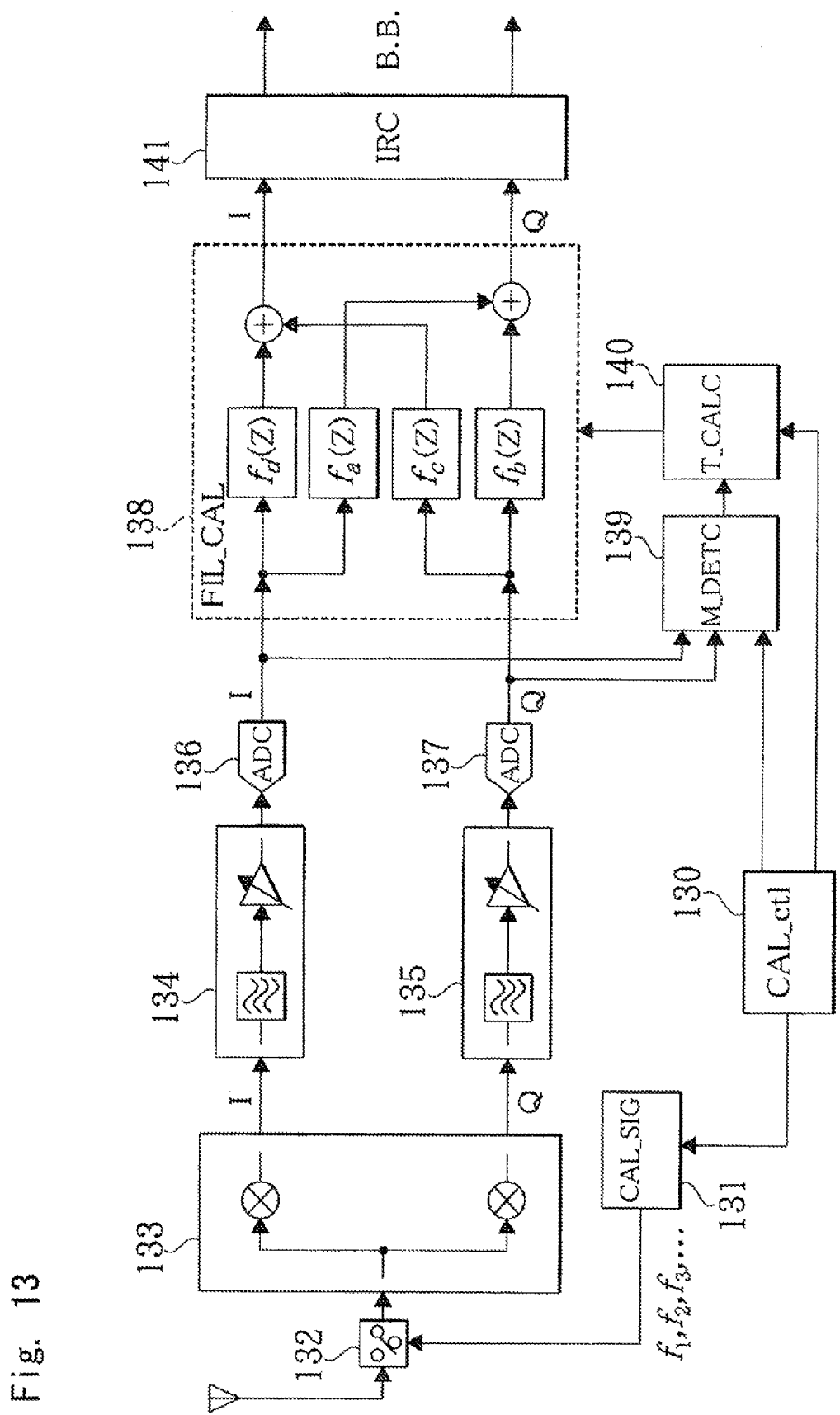
FIG. 13 is a block diagram showing another exemplary electrical configuration of a related art according to the present invention.

FIG. 9 is a block diagram showing an electrical configuration of a low IF type receiver apparatus according to a second exemplary embodiment of the present invention.

The configuration of this exemplary embodiment greatly differs from that of the first exemplary embodiment in that the output of the quadrature mixer is differentiated and that the subsequent signal processing is performed differentially.

Specifically, as shown in FIG. 9, a low IF type receiver apparatus 10B of this exemplary embodiment is generally composed of an IF band simulated image signal generating unit 12B, a path switch 13B, a differential quadrature mixer 14B, a local oscillator 15B, a complex filter 16B, an amplitude detecting unit 17, and an element value control unit 18B.

The IF band simulated image signal generating unit 12B is a circuit which generates the IF band simulated image signals IM-I and IM-IB and IF band simulated image signals IM-Q and IM-QB output from the IF band simulated image signal generating unit 12 as shown in FIG. 2 referred to in the description of the first exemplary embodiment.

The path switch 13B is a switch which selectively supplies the high-frequency received signal and the IF band simulated image signals IM-I and IM-IB and the IF band simulated image signals IM-Q and IM-QB, which are output from the IF band simulated image signal generating unit 12B, to the differential quadrature mixer 14B. In order to selectively supply these signals, switches 33 and 34 are provided in addition to the switches 31 and 32 of the first exemplary embodiment. The switch 33 supplies to an IB mixer 51B one of the high-frequency received signal and the IF band simulated image signal IM-IB output from the IF band simulated image signal generating unit 12B. The switch 34 supplies to a QB mixer 52B one of the high-frequency received signal and the IF band simulated image signal IM-QB output from the IF band simulated image signal generating unit 12A.

The differential quadrature mixer 14B is a circuit which down-converts the high-frequency received signal received from the path switch 13B, and outputs the IF band actual signal and the image signal, which is an unwanted component signal accompanied by the IF band actual signal. In addition, the differential quadrature mixer 14B allows the IF band simulated image signals IM-I and IM-IB and IF band simulated image signals IM-Q and IM-QB, which are supplied from the IF band simulated image signal generating unit 12B through the path switch 13A, to be fed therethrough and output.

The local oscillator (LO) 15B supplies the I mixer 51 and the I mixer 51B with a local oscillation signal LO-I and a local oscillation signal LO-IB, respectively, and also supplies the I mixer 52 and the I mixer 52B with a local oscillation signal LO-Q and a local oscillation signal LO-QB, respectively. The local oscillation signal LO-I and the local oscillation signal LO-IB are different from each other by 180 degrees, and the local oscillation signal LO-Q and the local oscillation signal LO-QB are different from each other by 180 degrees.

The complex filter 16B includes an I filter 61B and a Q filter 62B. The I filter 61B is a filter having a function of improving the image rejection ratio by decreasing the amplitudes of the IF band simulated image signals output from the I mixer 51 and the IB mixer 51B, and the Q filter 62B is a filter having a function of improving the image rejection ratio by decreasing the amplitudes of the IF band simulated image signals output from the Q mixer 52 and the QB mixer 52B.

This function is configured in the same structure as the first exemplary embodiment in which the element value control unit 18B controls the element values of the constituent elements of the I filter 61B and the Q filter 62B based on the amplitudes of the output signals of the complex filter 16B, which are detected by the amplitude detecting unit 17, so as to decrease the amplitudes of the IF band simulated image signals output from the I mixer 51 and IB mixer 51B and the Q mixer 52 and QB mixer 52B, like in the first exemplary embodiment.

The other configuration of this exemplary embodiment is the same as that of the first exemplary embodiment, so the same constituent parts are denoted by the same reference symbols and the duplicate description thereof is omitted.

Referring next to FIG. 9, operation of this exemplary embodiment will be described.

According to this exemplary embodiment, when the IF type receiver apparatus 10B operates in the calibration mode, the IF band simulated image signals IM-I and IM-IB are supplied to the I mixer 51 and the IB mixer 51B, respectively, and the IF band simulated image signals IM-Q and IM-QB are supplied to the Q mixer 52 and the QB mixer 52B, respectively, from the IF band simulated image signal generating unit 12B through the path switch 13B.

The IF band simulated image signal IM-I fed through the I mixer 51 and output therefrom, and the IF band simulated image signal IM-IB is fed through the IB mixer 51B and output therefrom. Similarly, the IF band simulated image signal IM-Q is fed through the QB mixer 52 and output therefrom, and the IF band simulated image signal IM-QB is fed through the QB mixer 52B and output therefrom.

In short, the differential quadrature mixer 14B differentiates and outputs I signal components and Q signal components.

The differentiated I signal components IF-I and IF-IB are supplied to the I filter 61B, and the differentiated Q signal components IF-Q and IF-QB are supplied to the Q filter 62B. The amplitudes of the I signal component IF-I output from the I filter 61B and the Q signal component IF-Q output from the Q filter 62B are detected by the amplitude detecting unit 17.

Like in the first exemplary embodiment, based on the amplitudes of the detected I signal component IF-I and Q signal component IF-Q, the element value control unit 18B controls the element values of the constituent elements of the I filter 61B and the Q filter 62B in such a manner that the amplitudes of the IF hand simulated image signals are decreased.

Thus, according to the configuration of this exemplary embodiment, the differentiated IF band simulated image signals are input to the differential quadrature mixer, and the subsequent signal processing is differentially performed. Therefore, in addition to the effects obtained in the first exemplary embodiment, such effects as improvement in resistance to noise due to power supply, increase in signal amplitude, and cancellation of even high frequencies can be obtained. This results in an improvement in the dynamic range.

While exemplary embodiments of the present invention have been described in detail above with reference to the drawings, the specific configuration of the present invention is not limited to these exemplary embodiments, and design changes and the like may be made within the scope of the present invention and should be included in the scope of the present invention. For example, in the description of the complex filter 16 of the first exemplary embodiment, the necessity of the use of voltage-to-current converters having voltage-current conversion gains with opposite signs has been described, but examples of means constituting the voltage-to-current converters include a method for inputting a voltage signal having an opposite phase; and a method for obtaining a current signal having an opposite phase by causing the current signal to be returned by a current mirror circuit.

Further, examples of the method for adjusting the voltage-current conversion gains of the voltage-to-current converters include a method for switching a plurality of voltage-to-current converters provided in parallel with each other; a method for adjusting bias voltages of the voltage-to-current converters, and a method for effectively adjusting voltage-current conversion gains by intermittently retrieving output currents of voltage-to-current converters at a constant time rate.

In the above description, the primary Gm-C filter using the voltage-to-current converters and the capacitor is illustrated as a configuration example of the complex filter. As other examples, a filter composed of an operational amplifier, a resistor, and a capacitor, and a filter composed of an operational amplifier, a MOSFET, and a capacitor may be used. Furthermore, also in a digital filter, the amplitude and phase between IQ signals can be compensated for in a similar manner.

This exemplary embodiment shows an example in which the complex filter 16 is provided with a mechanism for adjusting the amplitude and phase. The quadrature mixer may be provided with the adjustment mechanism in a similar manner. Also in this case, the amplitude of the output signal of the complex filter 16 is detected, thereby enabling compensation of mismatches including a mismatch occurring in the complex filter 16.

The amplitude detecting unit 17 described in the first exemplary embodiment uses the output voltage signal of the complex filter 16 as the input signal, but the output voltage signal of the VGA 20 may also be used as the input signal. When the output voltage signals of the complex filter 16 and the VGA 20 are used as the input signals, the ADC 84 also serves as the ADC 21 shown in FIG. 1.

The amplitude detecting unit 17 may be configured digitally. The amplitude detecting unit 17 may have a configuration in which the squaring circuits 81 and 82 and the adder 83 are composed of digital circuits and the digital signal converted by the ADC 21 is used as the input digital signal. In this case, the ADC 84 is not necessary.

While the second exemplary embodiment has exemplified the configuration of the low IF type receiver apparatus using the LNA having a single phase output, an LNA having a differential signal output, and a single-phase differential conversion circuit may also be used.

Any of the above exemplary embodiments employs a mechanism for causing the IF band simulated image signal generating unit to input the IF band simulated image signals to the quadrature mixer of the low IF type receiver apparatus in the calibration mode of the low IF type receiver apparatus. However, the present invention can also be implemented by replacing the mechanism with a mechanism in which the IF band simulated image signals are transmitted from the transmission side of the quadrature modulation signal and input to the low IF type receiver apparatus.

While in the above exemplary embodiments, an example of the low IF type receiver apparatus that receives the quadrature modulation signal has been described, the present invention can also be implemented by a receiver apparatus that receives an amplitude-phase-modulated (APSK: amplitude phase shift keying) signal.

Although the present invention has been described above with reference to exemplary embodiments, the present invention is not limited to the above exemplary embodiments. The configuration and details of the present invention can be modified in various manners which can be understood by those skilled in the within the scope of the present invention.

This application is the National Phase of PCT/JP2009/007301, filed Dec. 25, 2009, which is based upon and claims the benefit of priority from Japanese patent application No. 2008-332675, filed on Dec. 26, 2008, the disclosure of which is incorporated herein in its entirety by reference.

INDUSTRIAL APPLICABILITY

The invention herein disclosed is applicable to various receiver apparatuses and signal processing apparatuses which require removal of an unwanted signal component accompanied by an actual signal obtained from a received signal during processing of the received signal.

REFERENCE SIGNS LIST 10, 10B LOW IF TYPE RECEIVER APPARATUS (RECEIVER APPARATUS)
12, 12B IF BAND SIMULATED IMAGE SIGNAL GENERATING UNIT (A PART OF SIGNAL SUPPLY SECTION)
13, 13A, 13B PATH SWITCH (REMAINDER OF SIGNAL SUPPLY SECTION)
14, 14B QUADRATURE MIXER (SIGNAL PROCESSING SECTION, MIXER)
14B DIFFERENTIAL QUADRATURE MIXER (SIGNAL PROCESSING SECTION, MIXER)
15, 15B LOCAL OSCILLATOR
16, 16A, 16B COMPLEX FILTER (FILTERING SECTION)
17 AMPLITUDE DETECTING UNIT (AMPLITUDE DETECTING SECTION)
18, 18B ELEMENT VALUE CONTROL UNIT (ELEMENT VALUE CONTROL SECTION)
61, 61B I-FILTER (FIRST FILTER)
62, 62B Q-FILTER (SECOND FILTER)
63a VOLTAGE-TO-CURRENT CONVERTER (FIRST VOLTAGE-TO-CURRENT CONVERTER)
64a VOLTAGE-TO-CURRENT CONVERTER
65a VOLTAGE-TO-CURRENT CONVERTER (SECOND VOLTAGE-TO-CURRENT CONVERTER)
66a VOLTAGE-TO-CURRENT CONVERTER
63b VOLTAGE-TO-CURRENT CONVERTER (THIRD VOLTAGE-TO-CURRENT CONVERTER)
64b VOLTAGE-TO-CURRENT CONVERTER
65b VOLTAGE-TO-CURRENT CONVERTER (FOURTH VOLTAGE-TO-CURRENT CONVERTER)
66b VOLTAGE-TO-CURRENT CONVERTER
65c VOLTAGE-TO-CURRENT CONVERTER (FIFTH VOLTAGE-TO-CURRENT CONVERTER)
66d VOLTAGE-TO-CURRENT CONVERTER (FIFTH VOLTAGE-TO-CURRENT CONVERTER)
67a CAPACITOR (FIRST ELECTROSTATIC CAPACITOR)
67b CAPACITOR (SECOND ELECTROSTATIC CAPACITOR)

The invention claimed is:

1. A receiver apparatus comprising:
a signal processing section that outputs an actual signal and an image signal based on a received signal;
a signal supply section that supplies a simulated image signal obtained by simulating the image signal as a calibration signal to the signal processing section in a calibration mode for adjusting an attenuance of the image signal; and
a filtering section that attenuates the image signal and allows the actual signal to pass, after the attenuance of the image signal is adjusted using the calibration signal input through the signal processing section,
wherein the signal processing section comprises a mixer that down-converts an amplitude-phase-modulated received signal into a signal of an IF band, and outputs an IF band actual signal and an IF band image signal,
the filtering section attenuates the IF band image signal and allows the IF band actual signal to pass, after an attenuance of the IF band image signal is adjusted using a calibration signal input through the mixer, and
the signal supply section supplies an IF band simulated image signal obtained by simulating the IF band image signal as the calibration signal in the calibration mode for adjusting the attenuance of the IF band image signal in the filtering section,
wherein the amplitude-phase-modulated received signal is a quadrature-modulated received signal, and the mixer is a differential quadrature mixer,
wherein the signal supply section comprises:
an IF band simulated image signal generating section that generates an IF band simulated image signal of a differential form; and
a switch section that selectively supplies one of the received signal and the IF band simulated image signal of the differential form to the differential quadrature mixer, the IF band simulated image signal of the differential form being output from the IF band simulated image signal generating section.

2. The receiver apparatus according to claim 1, wherein the filtering section performs adjustment of the attenuance of the image signal by the filtering section itself and adjustment of the attenuance of the image signal by the signal processing section, or performs adjustment of the attenuance of the image signal only by the signal processing section.

3. The receiver apparatus according to claim 1, wherein the filtering section performs adjustment of the attenuance of the image signal by the filtering section itself and adjustment of the attenuance of the image signal by the mixer, or performs adjustment of the attenuance of the image signal only by the mixer.

4. The receiver apparatus according to claim 1, wherein the signal supply section comprises:
an IF band simulated image signal generating section that generates an IF band simulated image signal; and
a switch section that selectively supplies one of the received signal and the IF band simulated image signal to one of the mixer and the quadrature mixer, the IF band simulated image signal being output from the IF band simulated image signal generating section.

5. The receiver apparatus according to claim 1, wherein the filtering section includes a complex filter that receives first and second signals of a differential form output from the differential quadrature mixer, the first and second signals of the differential form having a quadrature relation.

6. A receiver apparatus comprising:
a signal processing section that outputs an actual signal and an image signal based on a received signal;
a signal supply section that supplies a simulated image signal obtained by simulating the image signal as a calibration signal to the signal processing section in a calibration mode for adjusting an attenuance of the image signal; and
a filtering section that attenuates the image signal and allows the actual signal to pass, after the attenuance of the image signal is adjusted using the calibration signal input through the signal processing section,
wherein the signal processing section comprises a mixer that down-converts an amplitude-phase-modulated received signal into a signal of an IF band, and outputs an IF band actual signal and an IF band image signal,
the filtering section attenuates the IF band image signal and allows the IF band actual signal to pass, after an attenuance of the IF band image signal is adjusted using a calibration signal input through the mixer, and
the signal supply section supplies an IF band simulated image signal obtained by simulating the IF band image signal as the calibration signal in the calibration mode for adjusting the attenuance of the IF band image signal in the filtering section,
wherein the amplitude-phase-modulated received signal is a quadrature-modulated received signal, and the mixer is a quadrature mixer,
wherein the filtering section includes a complex filter that receives first and second signals output from the quadrature mixer, the first and second signals having a quadrature relation,
wherein
the complex filter includes:
a first filter that receives the first signal; and
a second filter that receives the second signal,
the first filter includes:
a first voltage-to-current converter that receives a voltage of the first signal and outputs a current corresponding to the voltage to a first electrostatic capacitor; and
a second voltage-to-current converter that receives a voltage of the second signal and outputs a current corresponding to the voltage to the first electrostatic capacitor, and
the second filter includes:
a third voltage-to-current converter that receives a voltage of the second signal and outputs a current corresponding to the voltage to a second electrostatic capacitor; and
a fourth voltage-to-current converter that receives a voltage of the first signal and outputs a current corresponding to the voltage to the second electrostatic capacitor.

7. The receiver apparatus according to claim 6, wherein at least one of the mixer and the complex filter includes at least one variable element capable of changing an element value.

8. The receiver apparatus according to claim 6, comprising:
an amplitude detecting section that detects an amplitude of a signal output from the complex filter; and
an element value control section that controls an element value of at least one of the mixer and the complex filter based on the amplitude detected by the amplitude detecting section,
wherein the element value is controlled when the signal supply section supplies the IF band simulated image signal to the mixer.

9. The receiver apparatus according to claim 6, wherein at least one voltage-current conversion gain of the first and second voltage-to-current converters and the third and fourth voltage-to-current converters of the complex filter is variable.

10. The receiver apparatus according to claim 6, wherein the complex filter includes a fifth voltage-to-current converter which is disposed in parallel with the second voltage-to-current converter and the fourth voltage-to-current converter and has a voltage-current conversion gain with an opposite sign to that of the second voltage-to-current converter and the fourth voltage-to-current converter.

* * * * *